(12) United States Patent
Alam et al.

(10) Patent No.: US 12,067,232 B2
(45) Date of Patent: *Aug. 20, 2024

(54) SYSTEMS AND METHODS FOR NOR PAGE WRITE EMULATION MODE IN SERIAL STT-MRAM

(71) Applicant: Everspin Technologies, Inc., Chandler, AZ (US)

(72) Inventors: Syed M. Alam, Austin, TX (US); Cristian P. Masgras, Round Rock, TX (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/447,031

(22) Filed: Aug. 9, 2023

(65) Prior Publication Data

US 2023/0384930 A1     Nov. 30, 2023

Related U.S. Application Data

(63) Continuation of application No. 17/201,924, filed on Mar. 15, 2021, now Pat. No. 11,762,552.

(51) Int. Cl.
*G06F 3/06*     (2006.01)

(52) U.S. Cl.
CPC .......... *G06F 3/0601* (2013.01); *G06F 3/0604* (2013.01); *G06F 3/0673* (2013.01)

(58) Field of Classification Search
CPC ..... G06F 3/0601; G06F 3/0604; G06F 3/0673
See application file for complete search history.

(56) References Cited

U.S. PATENT DOCUMENTS

| | | | |
|---|---|---|---|
| 9,436,693 B1* | 9/2016 | Lockhart | G06F 16/128 |
| 2011/0320773 A1 | 12/2011 | Greiner et al. | |
| 2012/0072651 A1 | 3/2012 | Randell et al. | |
| 2012/0182795 A1 | 7/2012 | Estakhri et al. | |
| 2013/0311717 A1 | 11/2013 | Kim et al. | |
| 2014/0016404 A1 | 1/2014 | Kim et al. | |
| 2014/0189245 A1 | 7/2014 | Rupley et al. | |
| 2015/0019806 A1 | 1/2015 | Alam et al. | |
| 2018/0012655 A1 | 1/2018 | Senoo et al. | |
| 2018/0136851 A1 | 5/2018 | Batra et al. | |
| 2019/0050341 A1 | 2/2019 | Veal et al. | |
| 2020/0335145 A1 | 10/2020 | Jung | |
| 2021/0026560 A1 | 1/2021 | Pillai et al. | |
| 2022/0291883 A1 | 9/2022 | Alam et al. | |

OTHER PUBLICATIONS

European Search Report in corresponding Application No. 22156151.7, dated Jul. 22, 2022 (9 pages).
Examination Report issued in corresponding European Patent Application No. 22156151.7, dated May 24, 2024, pp. 1-5.

* cited by examiner

*Primary Examiner* — Baboucarr Faal
(74) *Attorney, Agent, or Firm* — Bookoff McAndrews, PLLC

(57) ABSTRACT

The present disclosure is drawn to, among other things, a method of managing a magnetoresistive memory (MRAM) device. In some aspects, the method includes receiving a configuration bit from a write mode configuration register. In response to determining the configuration bit is a first value, the MRAM device is operated in a NOR emulation mode. In response to determining the configuration bit is a second value, the MRAM device is operated in a persistent memory mode.

20 Claims, 6 Drawing Sheets

US 12,067,232 B2

SYSTEMS AND METHODS FOR NOR PAGE WRITE EMULATION MODE IN SERIAL STT-MRAM

CROSS-REFERENCE TO RELATED APPLICATION(S)

This patent application is a continuation of and claims the benefit of priority to U.S. application Ser. No. 17/201,924, filed on Mar. 15, 2021, the entirety of which is incorporated herein by reference.

TECHNICAL FIELD

Embodiments of the present disclosure relate to, among other things, systems and methods for operating a MRAM device in multiple modes, including a mode for emulating operation of a NOR memory.

INTRODUCTION

In general, a memory system may include a memory device for storing data and a host (or controller) for controlling operations of the memory device. Memory devices may be classified into volatile memory (such as, e.g., dynamic random-access memory (DRAM), static random-access memory (SRAM), etc.) and non-volatile memory (such as, e.g., electrically erasable programmable read-only memory (EEPROM), ferroelectric random-access memory (FRAM), phase-change memory (PRAM), magnetoresistive memory (MRAM), resistive random-access memory (RRAM/ReRAM), flash memory, etc.).

Spin-torque magnetic memory devices store information by controlling the resistance across a magnetic tunnel junction (MTJ) such that a read current through the MTJ results in a voltage drop having a magnitude that is based on the state of the magnetoresistive stack. The resistance in each MTJ can be varied based on the relative magnetic states of the magnetoresistive layers within the magnetoresistive stack. In such memory devices, there is typically a portion of the magnetoresistive stack that has a fixed magnetic state and another portion that has a free magnetic state that is controlled to be either of two possible states relative to the portion having the fixed magnetic state. Because the resistance through the MTJ changes based on the orientation of the free portion relative to the fixed portion, information can be stored by setting the orientation of the free portion. The information is later retrieved by sensing the orientation of the free portion.

BRIEF DESCRIPTION OF THE DRAWINGS

In the course of the detailed description that follows, reference will be made to the appended drawings. The drawings show different aspects of the present disclosure and, where appropriate, reference numerals illustrating like structures, components, materials, and/or elements in different figures are labeled similarly. It is understood that various combinations of the structures, components, and/or elements, other than those specifically shown, are contemplated and are within the scope of the present disclosure.

Moreover, there are many embodiments of the present disclosure described and illustrated herein. The present disclosure is neither limited to any single aspect nor embodiment thereof, nor to any combinations and/or permutations of such aspects and/or embodiments. Moreover, each of the aspects of the present disclosure, and/or embodiments thereof, may be employed alone or in combination with one or more of the other aspects of the present disclosure and/or embodiments thereof. For the sake of brevity, certain permutations and combinations are not discussed and/or illustrated separately herein; however, all permutations and combinations are considered to fall within the scope of the present inventions.

Figure 1:
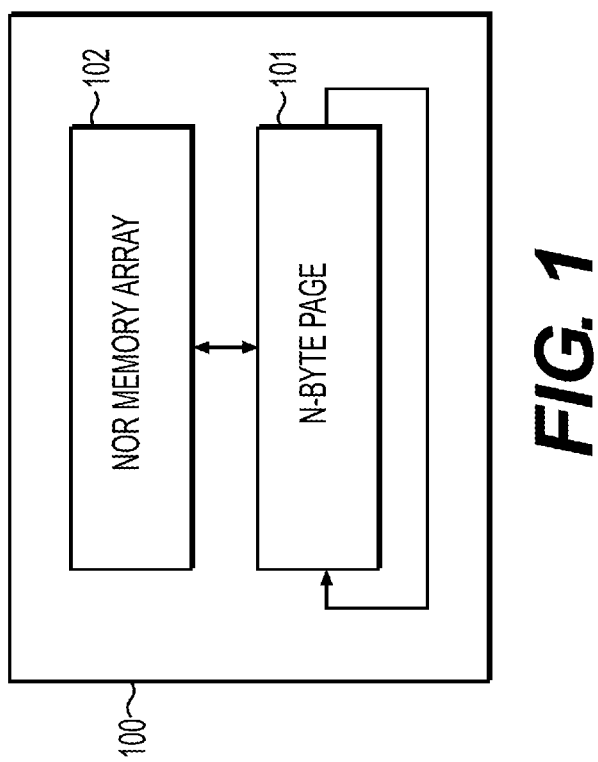
FIG. 1 depicts an exemplary NOR memory device.

Again, there are many embodiments described and illustrated herein. The present disclosure is neither limited to any single aspect nor embodiment thereof, nor to any combinations and/or permutations of such aspects and/or embodiments. Each of the aspects of the present disclosure, and/or embodiments thereof, may be employed alone or in combination with one or more of the other aspects of the present disclosure and/or embodiments thereof. For the sake of brevity, many of those combinations and permutations are not discussed separately herein.

DETAILED DESCRIPTION

Detailed illustrative aspects are disclosed herein. However, specific structural and functional details disclosed herein are merely representative for purposes of describing example embodiments of the present disclosure. The present disclosure may be embodied in many alternate forms and should not be construed as limited to only the embodiments set forth herein. Further, the terminology used herein is for the purpose of describing particular embodiments only and is not intended to be limiting of exemplary embodiments described herein.

When the specification makes reference to "one embodiment" or to "an embodiment," it is intended to mean that a particular feature, structure, characteristic, or function described in connection with the embodiment being discussed is included in at least one contemplated embodiment of the present disclosure. Thus, the appearance of the phrases, "in one embodiment" or "in an embodiment," in different places in the specification does not constitute a plurality of references to a single embodiment of the present disclosure.

As used herein, the singular forms "a," "an," and "the" are intended to include the plural forms as well, unless the context clearly indicates otherwise. It also should be noted that in some alternative implementations, the features and/or steps described may occur out of the order depicted in the figures or discussed herein. For example, two steps or figures shown in succession may instead be executed substantially concurrently or may sometimes be executed in the reverse order, depending upon the functionality/acts involved. In some aspects, one or more described features or steps may be omitted altogether, or may be performed with an intermediate step therebetween, without departing from the scope of the embodiments described herein, depending upon the functionality/acts involved.

It should be noted that the description set forth herein is merely illustrative in nature and is not intended to limit the embodiments of the subject matter, or the application and uses of such embodiments. Any implementation described herein as exemplary is not to be construed as preferred or advantageous over other implementations. Rather, the term "exemplary" is used in the sense of example or "illustrative," rather than "ideal." The terms "comprise," "include," "have," "with," and any variations thereof are used synonymously to denote or describe a non-exclusive inclusion. As such, a device or a method that uses such terms does not include only those elements or steps, but may include other elements and steps not expressly listed or inherent to such device and method. Further, the terms "first," "second," and the like, herein do not denote any order, quantity, or importance, but rather are used to distinguish one element from another. Similarly, terms of relative orientation, such as "top," "bottom," etc. are used with reference to the orientation of the structure illustrated in the figures being described.

In one aspect, the present disclosure is directed to techniques and implementations to dynamically monitor and manage memory devices, including, e.g., non-volatile or "permanent" memory capable of maintaining data when a power supply is deactivated (e.g., MRAMs). Though the description below makes reference to MRAM devices, the inventions may be implemented in other memory devices including, but not limited to, EEPROM, FRAM, PRAM, RRAM/Re RAM and/or flash memory.

MRAM devices and other memory devices often include an array of memory cells divided into a plurality of banks or subarrays. In such memory devices, each bank can be accessed separately such that accesses between banks can be interleaved to optimize data throughput. Some magnetic memory devices support dual data rate (DDR) memory protocols, where an activate operation opens a page of memory cells in a particular bank. A "page" of memory cells is understood to be a grouping of memory cells that are accessed together as a unit. In some instances, a "page" may constitute a "row" of memory cells. Opening a page moves the data for the page from the array of memory cells into a cache or other form of temporary storage where the data is more readily accessed. Once the page is activated (opened), read and write operations to the page can be performed. Upon completion of the read/write operations for the open page, the page is closed. When a page is closed, the array is returned to a state ready for a subsequent page activation, and the data in the closed page cannot be accessed again for reads and writes without re-opening the page. In some memory devices, data moved to temporary storage during the activate command is immediately written back to the array, and, in some cases, data corresponding to write operations performed while the page is opened is also immediately written to the memory cells in the array.

With reference now to FIG. 1, there is depicted an exemplary NOR memory device 100. A serial NOR memory device 100 performs a page program operation using a page buffer (e.g., 256-byte buffer, 512-byte buffer, etc.) for writing data. The serial NOR memory device 100 may include an expanded serial peripheral interface (xSPI), Qual, Dual, or Octal serial peripheral interface. The exemplary NOR memory device 100 in FIG. 1 includes an N-byte page buffer 101 and NOR memory array 102, where the size of NOR memory array 102 may be significantly larger in density than the page buffer 101. In a serial NOR memory device, if more than a page is written to the device, the sequence of data bytes will wrap from the last byte to the first byte of the page buffer. For example, if a sequence of data bytes being written to the memory goes beyond the size of the page buffer (e.g., 256 bytes, 512 bytes, etc.), the data writing sequence will wrap from the last byte to the first byte in the page buffer, overwriting the previously written data within the page buffer with new data.

Figure 2:
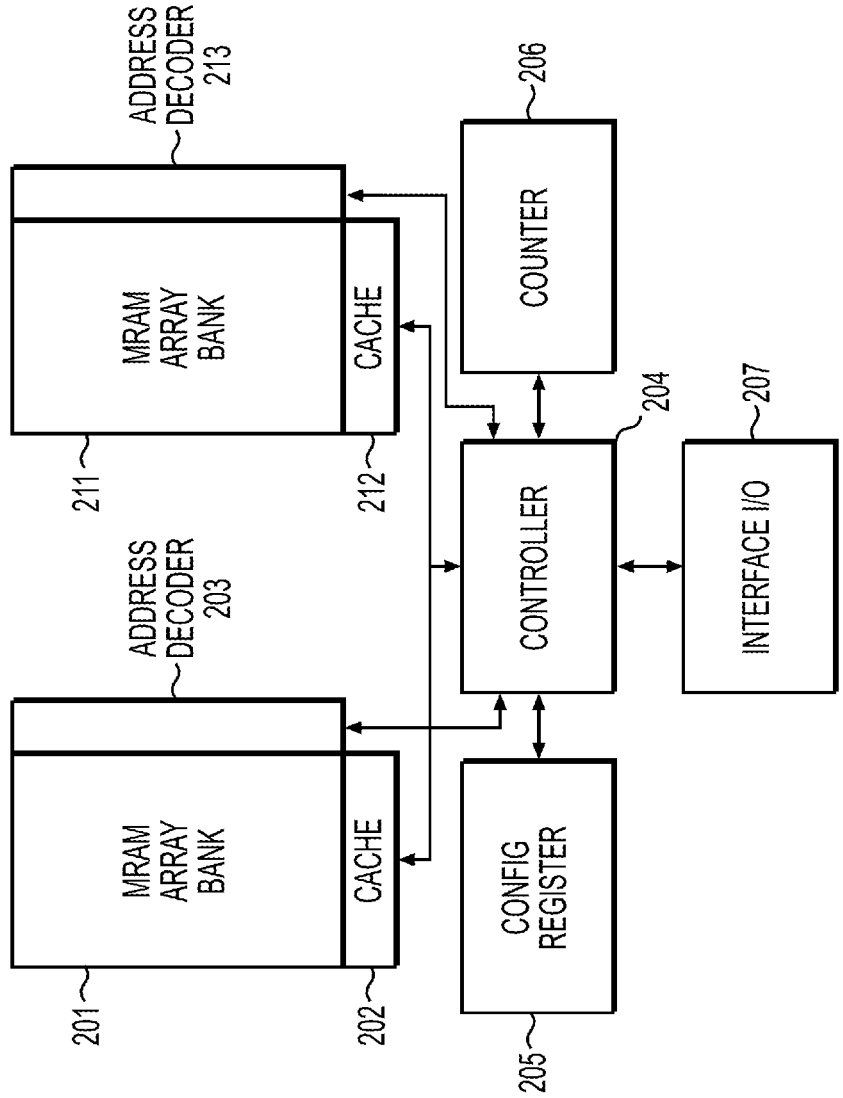
FIG. 2 depicts a block diagram of an exemplary MRAM device, according to an aspect of the present disclosure.

With reference to FIG. 2, there is depicted a schematic diagram of an MRAM device, according to an exemplary embodiment. The writing speed of an MRAM device may be faster than that of the serial NOR memory device discussed above in reference to FIG. 1. For instance, writing to a local storage (e.g., cache) of the MRAM device may be performed while simultaneously writing data from the local storage to the main memory array, and the writes to the main memory array may be performed relatively quickly (e.g., compared to NOR memory devices). Therefore, an MRAM device may allow a write operation for data having a size from 1 byte to essentially an infinite number of bytes. Thus, an MRAM device does not have a limitation of performing a page program operation using a page buffer having a set size as in a NOR memory device, because writing to a main memory array may be performed in the background while simultaneously writing to the local storage (e.g., cache). Because the write to the main memory array is fast in an MRAM device, the cache size may be kept small (e.g., 256 bits) and the writing to the main memory array may be performed in parallel to the writing to the cache. Additionally, functionality is improved because the controller may stop data transmission into the memory array at any time, after 1 byte is written.

As shown in FIG. 2, an MRAM device may include a first MRAM array bank 201 and a second MRAM array bank 211. A controller 204 may be connected to a cache 202 and an address decoder 203 of the first MRAM array bank 201, a cache 212 and an address decoder 213 of the second MRAM array bank 211, a configuration register 205, a counter 206, and an input/output interface 207. The array banks 201, 211 may be accessed independently from each other for reading and/or writing to any desired address. The caches 202 and 212 are coupled to array banks 201 and 211, respectively, to allow data to be transferred between the array banks and the caches. In some embodiments, each of the caches 202 and 212 includes static random access memory (SRAM) memory cells, whereas in some embodiments, the caches 202 and 212 are made up of registers, flip-flops, or other storage circuits that are used to store data. Caches 202 and 212 include enough storage to accommodate a page of data from the array banks and may also include additional storage to store the address of the page, parity or other error correction code (ECC) information for the page, and any inversion or other information relevant to the page. Example sizes for the caches may include 32-bit and 256-bit, however, example embodiments are not limited to these sizes. The size of the caches and that of the pages accessed can be adapted to suit the needs of the application.

The configuration register 205 may include at least one configuration register bit that identifies whether the MRAM device is operating in a first mode or a second mode. For example, the configuration register 205 may be a write mode configuration register that indicates whether the MRAM device is being operated in a NOR emulation mode (i.e., NOR Flash Program mode) or a persistent memory mode. As an example, if the configuration register 205 contains a bit having a value of 0, then the MRAM device is being operated in the NOR emulation mode, and if the configuration register contains a bit having a value of 1, then the MRAM device is being operated in a persistent memory mode. The configuration register 205 may be written and/or read through the controller 204 and the interface I/O 207 (e.g., a serial interface connected to the controller 204 for external communication). The configuration register bit may be accessed (e.g., read or write) by a user via the interface I/O 207. The counter 206 may be used when the configuration register 205 is set to 0 to operate in a NOR emulation mode. As described below, the counter 206 and the controller 204 may be used together to identify when to wrap around a predefined address space (i.e., an address space having a fixed, predefined size, such as, e.g., a 256-byte address space) during a write/program command executed on the memory array banks.

When the MRAM device is operating in the NOR emulation mode, the MRAM device may operate such that a program and/or write address wraps around the address space of a fixed size (e.g., 256 bytes, 512 bytes, etc.), emulating NOR Flash programming as if a fixed-size page buffer (e.g., 256-byte page buffer, 512-byte page buffer, etc.) exists in the serial MRAM device. The wrapping technique overwrites the previous data stored at the starting address and subsequent addresses, which may begin anywhere inside the address space in the memory array banks. For example, the MRAM program/write commands may be executed like a 256-byte page buffer write operation in a NOR memory. In such a case, all data bytes transmitted beyond the end of the 256th byte in the address space may be written from the starting address of the same 256-byte page address. To improve the speed of writing operations, there may be two writing operations performed in parallel. For example, writing to the cache may be performed simultaneously with writing to the MRAM array banks.

The counter 206 may be an address counter used to keep track of when the wrapping should occur. For example, the address counter 206 may include a counter value that is incremented once for each byte that is written. When the counter value reaches the limit of a NOR memory buffer (e.g., 256 bytes), the controller 204 causes the next byte of data to be written to the starting address, writing over data that was previously written.

The first MRAM array bank 201 and the second MRAM array bank 211 may be used together to achieve a high speed serial interface (e.g., 200 MHz or more). With DDR, data may be obtained at both the rising edge and falling edge of the clock. With DDR, the first MRAM array bank 201 may initially be used to write the data. If the first MRAM array bank 201 is taking too much time to write a page (e.g., 256-bit page), the second MRAM array bank 211 may be used. For example, the first MRAM array bank 201 and the second MRAM array bank 211 may be used independently of each other to improve speed and performance of the MRAM device.

When the MRAM device is operating in the persistent memory mode, the MRAM device may operate as a serial MRAM device with persistent memory. The MRAM device does not have a limitation of performing a page program operation using a page buffer having a set size as in a NOR memory device. Therefore, the use of the counter 206 becomes unnecessary when operating in the persistent memory mode. For example, the MRAM device may perform a write operation for a data having a size from 1 byte to essentially an infinite number of bytes. Data may be written from the cache to the main memory array while additional data is written to the cache, as data may be written to the main memory array relatively quickly in an MRAM device (e.g., compared to NOR memory devices). The cache size may be kept small (e.g., 256 bits, which is much smaller to those of a NOR memory device, e.g., 256 bytes) because the writing to the main memory array is performed in parallel to the writing to the cache.

Figure 3:
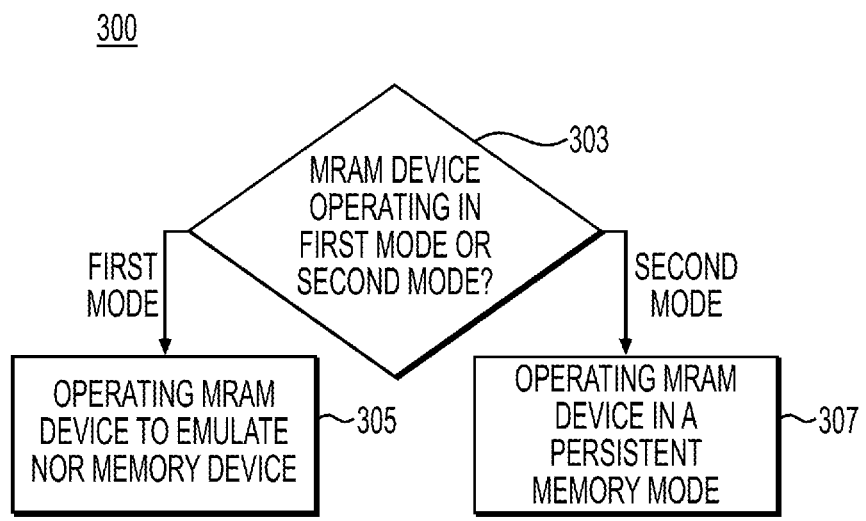
FIG. 3 depicts a flowchart for an exemplary method of operating an MRAM device, according to an aspect of the present disclosure.

FIG. 3 depicts a flowchart for an exemplary method 300 of operating an MRAM device. The method 300 may be performed by the controller 204 illustrated in FIGS. 2, 5, and 6. In step 303, the method 300 may include determining whether the MRAM device is operating in a first mode or a second mode. The first mode may be a NOR emulation mode, and the second mode may be a persistent memory mode. In step 305, the method 300 may include operating the MRAM device to emulate a NOR memory device in response to determining that the MRAM device is being operated in the first mode. As described above, in the first mode, the MRAM device may operate such that a program and/or write address wraps around the address space of a fixed size (e.g., 256 bytes, 512 bytes, etc.), emulating NOR Flash programming as if a fixed-size page buffer (e.g., 256-byte page buffer, 512-byte page buffer, etc.) exists in the serial MRAM device. The wrapping technique overwrites the previous data stored at the starting address, which may begin anywhere inside the address space. For example, the MRAM program/write commands may be executed like write operations in a NOR memory with a fixed-size page buffer.

In step 307, the method 300 may include operating the MRAM device in a persistent memory mode in response to determining that the MRAM device is being operated in a second mode. In the second mode, the MRAM device may operate as a serial MRAM device with persistent memory. For example, the MRAM device may perform a write operation for a data having a size from 1 byte to essentially an infinite number of bytes. Data may be written from the cache to the main memory array while additional data is written to the cache, as data may be written to the main memory array relatively quickly in an MRAM device (e.g., compared to NOR memory devices). The cache size may be kept small (e.g., 256 bits, which is much smaller to those of a NOR memory device, e.g., 256 bytes) because the writing to the main memory array is performed in parallel to the writing to the local storage.

Figure 4:
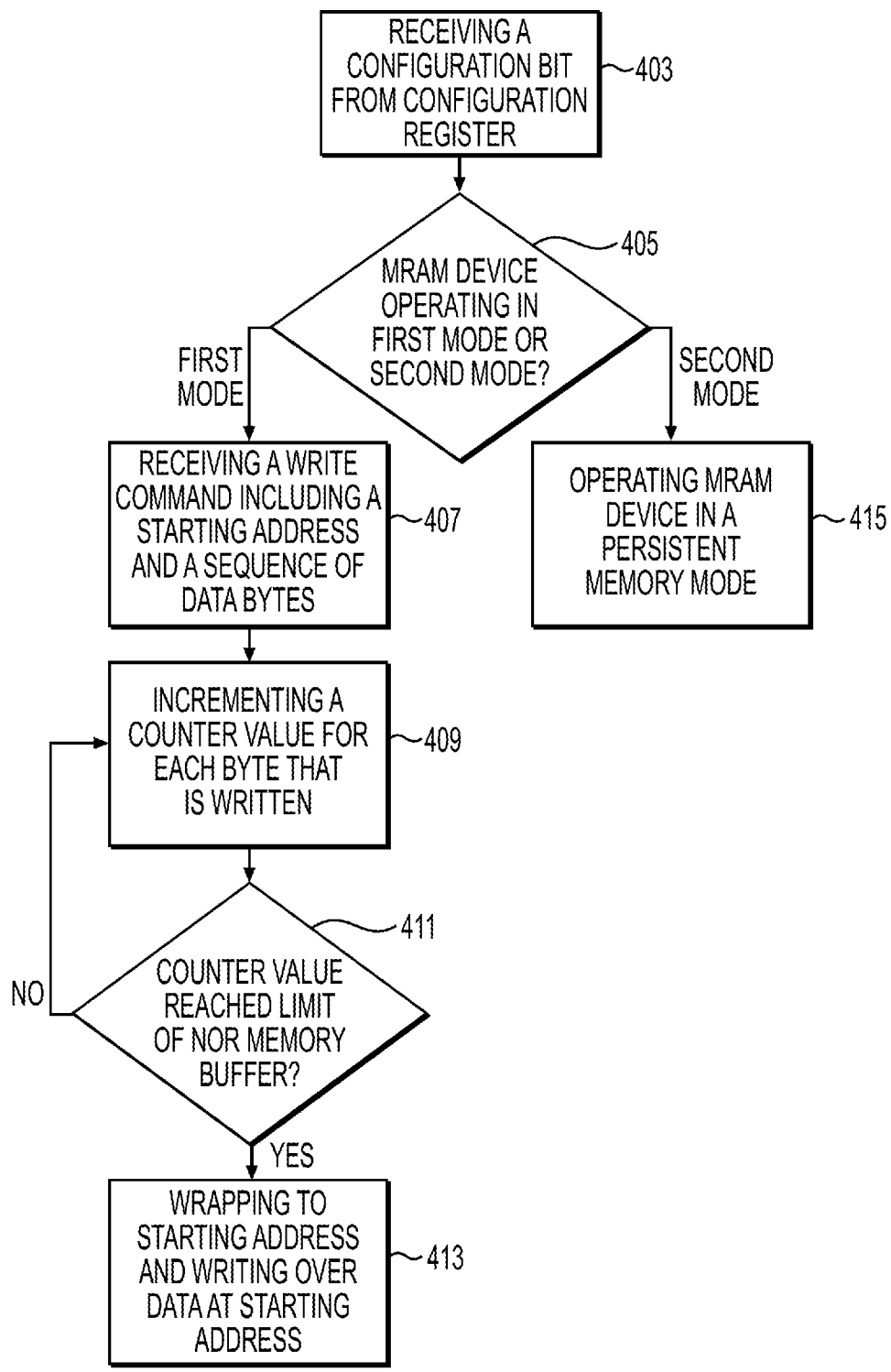
FIG. 4 depicts a flowchart for another exemplary method of operating an MRAM device, according to an aspect of the present disclosure.

FIG. 4 depicts a flowchart for an exemplary method 400 of operating an MRAM device. The method 400 may be a more detailed version of the method 300 illustrated in FIG. 3. In particular, steps 407, 409, 411, and 413 of the method 400 correspond to step 305 in FIG. 3. The method 400 may be performed by the controller 204 illustrated in FIGS. 2, 5, and 6. In step 403, the method 400 may include receiving a configuration bit (i.e., a write mode configuration bit) from the configuration register 205. In one embodiment, the configuration bit may be set according to a user input. In step 405, the method 400 may include determining whether the MRAM device is operating (or to be operated) in a first mode or a second mode based on the value of the configuration bit. If it is determined that the MRAM device is operating in a first mode based on the value of the configuration bit (e.g., "0"), the method 400 may proceed to step 407. In step 407, the method 400 may include receiving a write or program command including a starting address and a sequence of data bytes. In one embodiment, while receiving the sequence of data bytes, a predefined number of data bits (i.e., equal to the size of the cache/page, e.g., 256 bits) may be written at a time to MRAM array banks. In step 409, the method 400 may include incrementing a counter value in the counter 206 for each byte of data that is written. In one embodiment, the counter 206 may count for each byte of data received during the write or program command. In another embodiment, the counter 206 may count for each byte or for each page of data written to MRAM array banks. Yet in another embodiment, the counter may count address from the starting address provided by the write or program command to find the end address corresponding to NOR memory buffer size (e.g., 256 or 512 bytes). In step 411, the method 400 may include determining whether the counter value in the counter 206 has reached the size limit of a NOR memory page buffer (i.e., a predefined buffer size such as, e.g., 256 bytes, 512 bytes, etc.). In response to determining that the size limit of the NOR memory buffer has been reached, the method 400 may proceed to step 413. In step 413, the method 400 may include wrapping the address in the MRAM array bank back to the starting address and writing over data previously stored at the starting address.

If it is determined that the MRAM device is operating in a second mode based on the value of the configuration bit (e.g., "1"), the method 400 may proceed to step 415. In step 415, the method 400 may include operating the MRAM device in a persistent memory mode. In the second mode, the MRAM device may operate as a serial MRAM device with persistent memory as discussed above in reference to FIGS. 2 and 3. For example, the MRAM device may perform a write operation for a data having a size from 1 byte to essentially an infinite number of bytes. The writing to a main memory array (in the MRAM array bank) may be performed in the background while simultaneously writing to the cache. Because the write to the main memory array is fast in an MRAM device, the cache size may be kept small (e.g., 256 bits) because the writing to the main memory array is performed in parallel to the writing to the cache. In the event that a write command in the second mode provides a starting address and subsequently continuously provides data bytes (where extreme case is an infinite number of bytes), writes to the MRAM array banks will start from the starting address, continuously write until the last address, and then wrap around to the first address of the MRAM array banks. Thus, the wrap around occurs around the full address space of the MRAM array banks, not any predetermined buffer or cache size.

Figure 5:
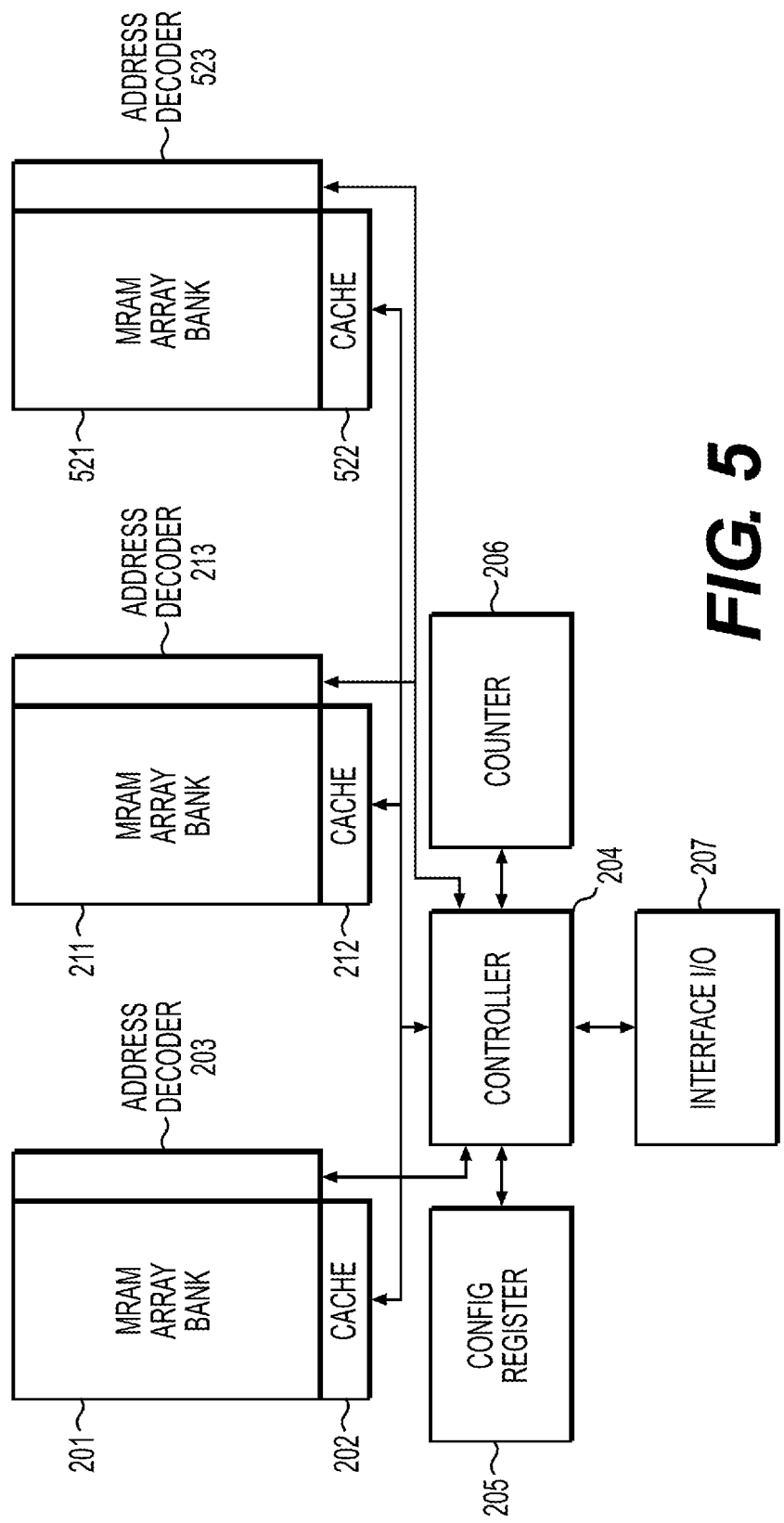
FIG. 5 depicts a block diagram of another exemplary MRAM device, according to an aspect of the present disclosure.
Figure 6:
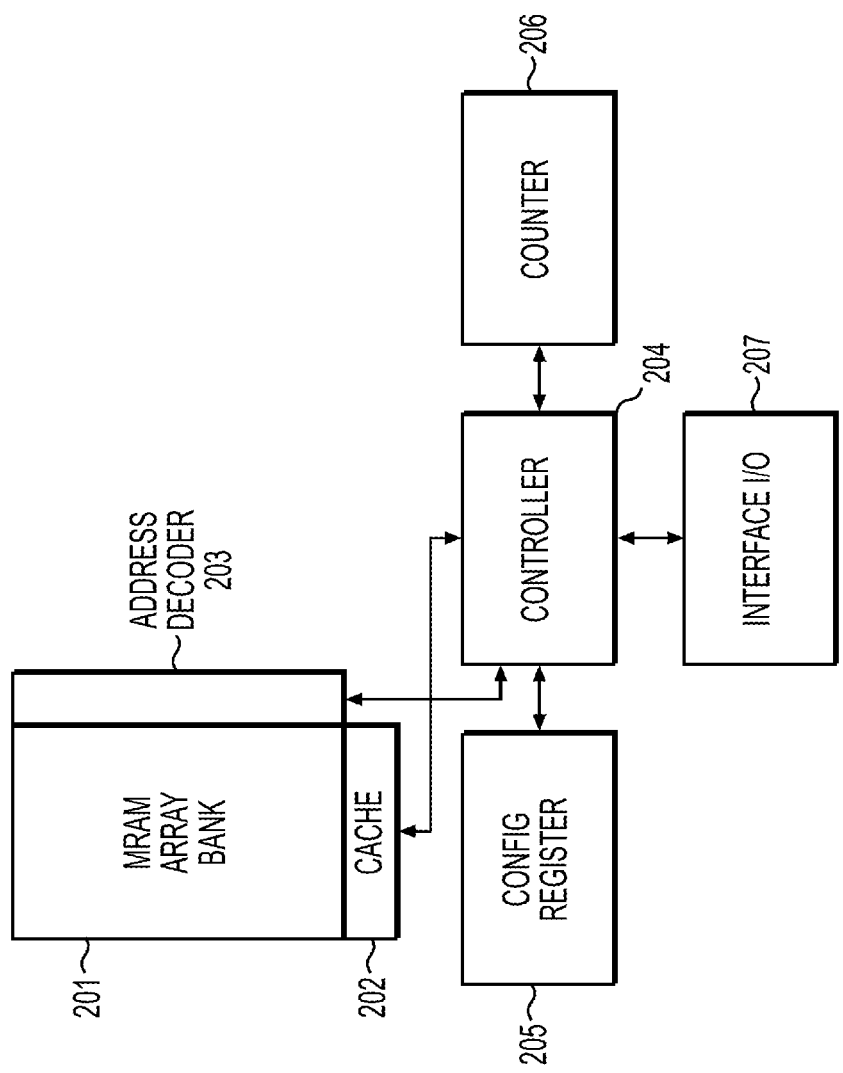
FIG. 6 depicts a block diagram of yet another exemplary MRAM device, according to an aspect of the present disclosure.

FIG. 5 depicts a block diagram of another exemplary MRAM device, according to an aspect of the present disclosure. As shown in FIG. 5, the MRAM device may include additional MRAM array banks to improve the speed of the reading and/or writing operations, compared to the MRAM device illustrated in FIG. 2. For example, the MRAM device may include a third MRAM array bank 521, a cache 522 and the address decoder 523, each of which is connected to the controller 204. The operations of the third MRAM array bank 521 may be similar to the first and second MRAM array banks 201 and 211. FIG. 6 depicts a block diagram of yet another exemplary MRAM device, according to an aspect of the present disclosure. As shown in FIG. 6, the MRAM device may include a single MRAM array bank 201 to, for example, reduce a size of the memory chip. It should be noted, however, that the MRAM devices illustrated in FIGS. 2, 5, and 6 of the present disclosure are examples only, and an MRAM device may have any number of MRAM array banks along with corresponding caches and address decoders.

In one embodiment, a method for managing a magnetoresistive memory (MRAM) device may include receiving a configuration bit from a write mode configuration register; in response to determining the configuration bit is a first value, operating the MRAM device in a NOR emulation mode; and in response to determining the configuration bit is a second value, operating the MRAM device in a persistent memory mode.

Various embodiments of the method may include wherein the first value is zero and the second value is one; wherein the configuration bit is set according to a user input; wherein operating the MRAM device in the NOR emulation mode comprises operating the MRAM device to emulate a NOR memory device; wherein operating the MRAM device to emulate the NOR memory device comprises: receiving a write or program command comprising a starting address and a sequence of data bytes; incrementing a counter value for each byte that is written to one or more memory array banks; and in response to the counter value reaching a predefined buffer size, wrapping to the starting address and writing the rest of the sequence of data bytes over data previously stored from the starting address; wherein operating the MRAM device to emulate the NOR memory device further comprises writing data to the one or more memory array banks while receiving the sequence of data bytes; wherein the predefined buffer size is 256 bytes; wherein operating the MRAM device in the persistent mode comprises simultaneously writing to a cache and a memory array bank; wherein operating the MRAM device in the NOR emulation mode or the persistent memory mode comprises writing data to a plurality of memory array banks; and wherein operating the MRAM device in the NOR emulation mode or the persistent memory mode comprises writing data to a memory array bank.

In one embodiment, magnetoresistive memory (MRAM) device may include one or more MRAM array banks; a write mode configuration register configured to register a configuration bit; and a controller configured to: receive a configuration bit from the write mode configuration register; in response to determining the configuration bit is a first value, operate the MRAM device in a NOR emulation mode; and in response to determining configuration bit is a second value, operate the MRAM device in a persistent memory mode.

Various embodiments of the memory device may include wherein the first value is one of zero and one, and the second value is the other of zero and one; wherein the configuration bit is registered in the write mode configuration register according to a user input; wherein operating the MRAM device in the NOR emulation mode comprises operating the MRAM device to emulate a NOR memory device; wherein operating the MRAM device to emulate the NOR memory device comprises: receiving a write or program command comprising a starting address and a sequence of data bytes; incrementing a counter value for each byte that is written to the one or more MRAM array banks; and in response to the counter value reaching a predefined buffer size, wrapping to the starting address and writing the rest of the sequence of data bytes over data previously stored from the starting address; wherein operating the MRAM device to emulate the NOR memory device further comprises writing data to the one or more MRAM array banks while receiving the sequence of data bytes; an address counter, wherein incrementing the counter value for each byte that is written to the one or more MRAM arrays banks is executed by the address counter; wherein operating the MRAM device in the persistent memory mode comprises simultaneously writing to a cache and an MRAM array bank; wherein a size of the cache is 256 bits; and wherein the MRAM device consists of two MRAM array banks.

The NOR emulation mode described above represents an operating mode where local storage or cache size is predetermined (e.g., 256 bytes) and smaller than the main memory array banks, wherein the address space associated with write or program command is limited to the size of the local storage or cache. Such an operating mode may be used in not only NOR memory devices, but also NAND memory devices and any other memory devices. Therefore, the embodiments described in the current disclosure may be applied to emulate page program operations of different types of memory devices associated with such an operation mode, and the embodiments described in the current disclosure are not necessarily limited to a "NOR" emulation mode.

The foregoing description of the inventions has been described for purposes of clarity and understanding. It is not intended to limit the inventions to the precise form disclosed. Various modifications may be possible within the scope and equivalence of the application.

We claim:

1. A method for managing a magnetoresistive memory (MRAM) device, comprising:
   receiving a configuration bit from a write mode configuration register;
   in response to determining the configuration bit is a first value, operating the MRAM device in a NOR emulation mode such that the MRAM device emulates a NOR memory device,
   wherein operating the MRAM device to emulate the NOR memory device comprises:
      receiving a write or program command comprising a starting address and a sequence of data bytes;
      incrementing a counter value for each byte that is written to one or more memory array banks; and
      in response to the counter value reaching a predefined buffer size, wrapping to the starting address and writing the rest of the sequence of data bytes over data previously stored from the starting address; and
   in response to determining the configuration bit is a second value, operating the MRAM device in a persistent memory mode.

2. The method of claim 1, wherein operating the MRAM device in the persistent memory mode includes the MRAM device operating as a serial MRAM device with persistent memory.

3. The method of claim 1, wherein the predefined buffer size is 256 bytes.

4. The method of claim 1, wherein the predefined buffer size is 512 bytes.

5. The method of claim 1, wherein operating the MRAM device in the persistent memory mode comprises simultaneously writing.

6. The method of claim 1, wherein the MRAM device consists of two MRAM array banks.

7. The method of claim 1, wherein the first value is zero and the second value is one, and wherein the configuration bit is set according to a user input.

8. The method of claim 1, wherein operating the MRAM device to emulate the NOR memory device further comprises writing data to the one or more memory array banks while receiving the sequence of data bytes.

9. The method of claim 1, wherein operating the MRAM device in the NOR emulation mode or the persistent memory mode comprises writing data to a plurality of memory array banks.

10. The method of claim 1, wherein operating the MRAM device in the NOR emulation mode or the persistent memory mode comprises writing data to the one or more memory array banks.

11. A magnetoresistive memory (MRAM) device, comprising:
   one or more MRAM array banks;
   a write mode configuration register configured to register a configuration bit; and
   a controller configured to:
      receive a configuration bit from the write mode configuration register;
      in response to determining the configuration bit is a first value, operate the MRAM device in a NOR emulation mode, wherein operating the MRAM device in the NOR emulation mode comprises:
         receiving a write or program command comprising a starting address and a sequence of data bytes;
         incrementing a counter value for each byte that is written to the one or more MRAM array banks; and
         in response to the counter value reaching a predefined buffer size, wrapping to the starting address and writing the rest of the sequence of data bytes over data previously stored from the starting address; and
      in response to determining configuration bit is a second value, operate the MRAM device in a persistent memory mode.

12. The MRAM device of claim 11, wherein operating the MRAM device in the persistent memory mode includes the MRAM device operating as a serial MRAM device with persistent memory.

13. The MRAM device of claim 11, wherein the predefined buffer size is at least 256 bytes.

14. The MRAM device of claim 11, wherein operating the MRAM device in the persistent memory mode comprises simultaneously writing.

15. The MRAM device of claim 11, wherein the MRAM device consists of two MRAM array banks.

16. The MRAM device of claim 11, wherein the first value is one of zero and one, and the second value is the other of zero and one, and wherein the configuration bit is registered in the write mode configuration register according to a user input.

17. The MRAM device of claim 11, further comprising an address counter, wherein incrementing the counter value for each byte that is written to the one or more MRAM arrays banks is executed by the address counter.

18. A magnetoresistive memory (MRAM) device, comprising:
   one or more MRAM array banks; and
   a controller configured to:
      receive a configuration bit;
      in response to determining the configuration bit is a first value, operate the MRAM device in a first mode, wherein operating the MRAM device in the first mode comprises:
         receiving a command comprising a starting address and a sequence of data bytes;
         incrementing a counter value for each byte that is written to the one or more MRAM array banks; and
         wrapping to the starting address and writing the rest of the sequence of data bytes over data previously stored from the starting address; and
      in response to determining configuration bit is a second value, operate the MRAM device in a second mode.

19. The MRAM device of claim 18, wherein the wrapping to the starting address is performed in the first mode in response to the counter value reaching a predefined buffer size, and wherein the predefined buffer size is 512 bytes.

20. The MRAM device of claim 18, wherein the MRAM device consists of two MRAM array banks, and
wherein the MRAM device further comprises an address counter, wherein incrementing the counter value for each byte that is written to the one or more MRAM arrays banks is executed by the address counter.

* * * * *